United States Patent
Zang et al.

(10) Patent No.: US 12,429,741 B2
(45) Date of Patent: *Sep. 30, 2025

(54) DUAL-GATE ARRAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Pengcheng Zang, Beijing (CN); Weiyun Huang, Beijing (CN); Xiaojing Qi, Beijing (CN); Tingliang Liu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/420,881

(22) Filed: Jan. 24, 2024

(65) Prior Publication Data

US 2024/0160070 A1 May 16, 2024

Related U.S. Application Data

(63) Continuation of application No. 17/884,708, filed on Aug. 10, 2022, now Pat. No. 11,906,864, which is a (Continued)

(30) Foreign Application Priority Data

Feb. 2, 2016 (CN) .......................... 201610074047.1

(51) Int. Cl.
*G02F 1/1362* (2006.01)
*G02F 1/1343* (2006.01)
(Continued)

(52) U.S. Cl.
CPC .. *G02F 1/136295* (2021.01); *G02F 1/134318* (2021.01); *G02F 1/134363* (2013.01); (Continued)

(58) Field of Classification Search
CPC ......... G02F 1/136295; G02F 1/134318; G02F 1/13606; H10D 86/441
See application file for complete search history.

(56) References Cited

U.S. PATENT DOCUMENTS 5,946,058 A 8/1999 Kamada et al.
6,040,882 A 3/2000 Jun et al.
(Continued)

FOREIGN PATENT DOCUMENTS

CN 1794067 A 6/2006
CN 101661174 A 3/2010
(Continued)

OTHER PUBLICATIONS

International Search Report and Written Opinion, including English translation of Box No. V. of the Written Opinion, of International Application No. PCT/CN2016/081109, dated Nov. 1, 2016, 14 pages.
(Continued)

*Primary Examiner* — Lucy P Chien
(74) *Attorney, Agent, or Firm* — Westman, Champlin & Koehler, P.A.

(57) ABSTRACT

A dual-gate array substrate includes: a plurality of gate lines arranged in a first direction and each extended in a second direction that is perpendicular to the first direction; a plurality of primary signal lines and secondary signal lines arranged alternately in the second direction and extended in the first direction; and a plurality of pixel units. The primary signal lines are connected to a drive unit, and connected respectively to the pixel units that are adjacent thereto.
(Continued)

Common electrodes include a plurality of main electrodes and a plurality of branching electrodes. An orthographic projection of the main electrode on the dual-gate array substrate does not overlap with those of corresponding ones, adjacent to the main electrode, of the pixel electrodes and at least covers the primary signal line. Each gate line includes a protrusion protruded in the first direction.

20 Claims, 11 Drawing Sheets

Related U.S. Application Data continuation-in-part of application No. 16/656,969, filed on Oct. 18, 2019, now Pat. No. 11,442,318, which is a continuation-in-part of application No. 15/519,596, filed as application No. PCT/CN2016/081109 on May 5, 2016, now Pat. No. 10,488,718.

(51) Int. Cl.
  G02F 1/136  (2006.01)
  G02F 1/1368  (2006.01)
  H10D 86/40  (2025.01)
  H10D 86/60  (2025.01)

(52) U.S. Cl.
  CPC ....... *G02F 1/13606* (2021.01); *H10D 86/441* (2025.01); *H10D 86/60* (2025.01); *G02F 1/134336* (2013.01); *G02F 1/1368* (2013.01); *G02F 2201/40* (2013.01)

(56) References Cited

U.S. PATENT DOCUMENTS

| | | |
|---|---|---|
| 7,405,427 B2 | 7/2008 | Lee et al. |
| 8,107,029 B2 | 1/2012 | Peng et al. |
| 8,129,723 B2 | 3/2012 | Lee et al. |
| 9,123,873 B2 | 9/2015 | Park et al. |
| 9,323,111 B2 | 4/2016 | Um et al. |
| 9,366,890 B2 | 6/2016 | Kim et al. |
| 9,496,286 B2 | 11/2016 | Jeon et al. |
| 9,515,096 B2 | 12/2016 | Park et al. |
| 9,773,819 B2 | 9/2017 | Cheng et al. |
| 9,798,197 B2 | 10/2017 | Kim et al. |
| 9,817,283 B2 | 11/2017 | Kim et al. |
| 9,995,976 B2 | 6/2018 | Jia et al. |
| 10,203,576 B2 | 2/2019 | Jeon et al. |
| 10,488,718 B2 | 11/2019 | Zang et al. |
| 2006/0138419 A1 | 6/2006 | Lee et al. |
| 2008/0258149 A1 | 10/2008 | Lee et al. |
| 2009/0102994 A1 | 4/2009 | Oh et al. |
| 2010/0053530 A1 | 3/2010 | Peng et al. |
| 2010/0225839 A1 | 9/2010 | Kim et al. |
| 2010/0225859 A1 | 9/2010 | Tsai et al. |
| 2011/0057898 A1 | 3/2011 | Huang et al. |
| 2011/0096600 A1 | 4/2011 | Noguchi |
| 2013/0021573 A1 | 1/2013 | Lim et al. |
| 2014/0098319 A1 | 4/2014 | Jeon et al. |
| 2014/0125626 A1 | 5/2014 | Yang et al. |
| 2014/0168555 A1 | 6/2014 | Um et al. |
| 2014/0191256 A1 | 7/2014 | Park et al. |
| 2014/0226100 A1 | 8/2014 | Kim et al. |
| 2014/0226101 A1 | 8/2014 | Kim et al. |
| 2015/0364497 A1 | 12/2015 | Park et al. |
| 2016/0252793 A1 | 9/2016 | Cheng et al. |
| 2016/0282685 A1 | 9/2016 | Kim et al. |
| 2017/0038657 A1 | 2/2017 | Jeon et al. |
| 2017/0108745 A1 | 4/2017 | Jia et al. |
| 2017/0160604 A1 | 6/2017 | Wang |
| 2018/0095334 A1 | 4/2018 | Zang et al. |

FOREIGN PATENT DOCUMENTS

| | | |
|---|---|---|
| CN | 102998859 A | 3/2013 |
| CN | 103713431 A | 4/2014 |
| CN | 103926770 A | 7/2014 |
| CN | 103941488 A | 7/2014 |
| CN | 103984162 A | 8/2014 |
| CN | 203941365 U | 11/2014 |
| CN | 104714345 A | 6/2015 |
| CN | 105159001 A | 12/2015 |
| CN | 105572996 A | 5/2016 |
| CN | 109491124 A | 3/2019 |
| KR | 10-0209281 B1 | 7/1999 |

OTHER PUBLICATIONS

English translation of International Search Report and Written Opinion of International Application No. PCT/CN2016/081109, dated Nov. 1, 2016, 13 pages.

Full, English Translation of Notification of Transmittal of International Search Report and Written Opinion of the International Searching Authority, or Declaration from International Application No. PCT/CN2016/081109, dated Jan. 11, 2016, 4 pages.

Full, English Translation of The International Search Report from International Application No. PCT/CN2016/081109, dated Oct. 12, 2016, 9 pages.

Full, English Translation of The Written Opinion of the International Searching Authority from International Application No. PCT/CN2016/081109, dated Nov. 1, 2016, 4 pages.

First Office Action, including Search Report, for Chinese Patent Application No. 201610074047.1, dated May 3, 2018, 10 pages.

U.S. Patent Office issued prosecution for U.S. Appl. No. 15/519,596, filed Apr. 17, 2017, including: Notice of Allowance and Fees Due (PTOL-85) issued Jul. 19, 2019, 10 pages; Non-Final Rejection issued Mar. 28, 2019, 13 pages; Advisory Action (PTOL-303) issued Nov. 8, 2018, 3 pages; Final Rejection issued Sep. 4, 2018, 14 pages; Non-Final Rejection issued May 18, 2018, 15 pages; 55 pages total.

First Office Action, including Search Report, for Chinese Patent Application No. 201910997730.6, dated May 7, 2022, 14 pages.

U.S. Patent Office issued prosecution for U.S. Appl. No. 16/656,969, filed Oct. 18, 2019, including: Corrected Notice of Allowability issued Jul. 27, 2022, 2 pages; Notice of Allowance and Fees Due (PTOL-85) issued May 10, 2022, 8 pages; Final Rejection issued Mar. 1, 2022, 14 pages; Non-Final Rejection issued Oct. 29, 2021, 13 pages; 37 pages total.

U.S. Patent Office issued prosecution for U.S. Appl. No. 17/884,708, filed Aug. 10, 2022, including: Notice of Allowance and Fees Due (PTOL-85) issued Nov. 8, 2023, 8 pages; Non-Final Rejection issued Jul. 14, 2023, 15 pages; 23 pages total.

DUAL-GATE ARRAY SUBSTRATE AND DISPLAY DEVICE

CROSS-REFERENCE TO RELATED APPLICATIONS

This application is a continuation application of U.S. application Ser. No. 17/884,708, filed on Aug. 10, 2022, the U.S. Ser. No. 17/884,708 is a continuation-in-part of U.S. application Ser. No. 16/656,969, filed on Oct. 18, 2019, and the U.S. Ser. No. 16/656,969 is a continuation-in-part of U.S. application Ser. No. 15/519,596, filed on Apr. 17, 2017, which is a Section 371 National Stage Application of International Application No. PCT/CN2016/081109, filed on May 5, 2016, entitled "DUAL-GATE ARRAY SUBSTRATE AND DISPLAY DEVICE", which claims priority to Chinese Application No. 201610074047.1, filed on Feb. 2, 2016, the contents of which are incorporated herein by reference in their entireties.

BACKGROUND

1. Technical Field

The present disclosure relates to display technical field, and particularly relates to a dual-gate array substrate and a display device.

2. Description of the Related Art

With increase of resolution of a display panel, performance and cost of a drive integrated circuit (IC) necessarily increase. Thus, in order to reduce cost of the drive integrated circuit (IC) while increasing binding yield of the drive integrated circuit (IC), a design scheme of dual-gate drive is commonly used in a display panel. However, it is still needed to further improve an opening ratio and transmission of the display panel.

SUMMARY

Embodiments of the present disclosure provide a dual-gate array substrate and a display device, which have increased transmission relative to the dual-gate array substrate in related art.

Embodiments of the present disclosure include the following technical solutions.

A dual-gate array substrate includes:
a plurality of gate lines arranged in a first direction, each of the gate lines being extended in a
second direction that is perpendicular to the first direction;
a plurality of primary signal lines and secondary signal lines arranged alternately in the second direction and extended in the first direction;
a plurality of pixel units being enclosed and defined by jointing adjacent two of the gate lines insulatively with the primary signal lines or the secondary signal lines, the primary signal lines being connected to a drive unit, and being connected respectively to the pixel units that are adjacent thereto;
wherein the dual-gate array substrate further includes common electrodes including a plurality of main electrodes and a plurality of branching electrodes;
wherein the secondary signal lines being connected to the common electrodes, and an orthographic projection of the main electrode on the dual-gate array substrate has overlapping regions respectively with orthographic projections of corresponding ones, adjacent to the main electrodes, of the pixel electrodes on the dual-gate array substrate and at least covers the primary signal line;
wherein each gate line includes a protrusion protruded in the first direction.

In an embodiment of the present disclosure, a width of the secondary signal line is not greater than a width of the primary signal line.

In an embodiment of the present disclosure, the main electrodes of the common electrodes are disposed in an extension direction of the primary signal lines, the branching electrodes are disposed to be parallel to the main electrodes, a pattern of the common electrodes formed by any adjacent two of the main electrodes and the secondary electrodes between the two main electrodes corresponds to a corresponding one of the pixel units;
wherein any two adjacent main electrodes include a first main electrode and a second main electrode, an orthographic projection of a first main electrode on the array substrate has overlapping regions respectively with orthographic projections of the pixel electrodes, adjacent to the first main electrode, on the dual-gate array substrate, and at least covers the primary signal lines, and an orthographic projection of a second main electrode, adjacent to the first main electrode, on the dual-gate array substrate is located within a gap between two pixel electrodes, adjacent to the second main electrode, and covers the secondary signal line.

In an embodiment of the present disclosure, the orthographic projection of the second main electrode, adjacent to the first main electrode, coincides with the secondary signal line.

In an embodiment of the present disclosure, the main electrodes of the common electrodes are disposed in an extension direction of the primary signal lines, the branching electrodes are disposed in a direction across the primary signal lines, and a pattern of the common electrodes formed by any adjacent two of the main electrodes and the secondary electrodes between the two main electrodes corresponds to adjacent two of the pixel units;
wherein orthographic projections of two of the main electrodes on the array substrate have overlapping regions respectively with orthographic projections of the pixel electrodes, adjacent to the two of the main electrodes, on the dual-gate array substrate, and at least cover the main signal lines, and a pattern of the secondary electrodes at a boundary between adjacent two of the adjacent pixel units is continuous.

In an embodiment of the present disclosure, the branching electrodes are each provided with a corner structure at the boundary between the adjacent two of the pixel units.

With this configuration, uneven display caused by movement or pressure action during touch operation may be eliminated.

In an embodiment of the present disclosure, the secondary signal lines are made of metal or transparent oxide.

In an embodiment of the present disclosure, the secondary signal lines are made of tin indium oxide.

Embodiments of the present disclosure provide a dual-gate array substrate, comprising:
a plurality of gate lines arranged in a first direction, each of the gate lines being extended in a second direction that is perpendicular to the first direction;
a plurality of primary signal lines and secondary signal lines arranged alternately in the second direction and extended in the first direction;

a plurality of pixel units each being enclosed and defined by jointing adjacent two of the gate lines insulative with corresponding ones of the primary signal lines or the secondary signal lines, the pixel units each including pixel electrodes, the primary signal lines being connected to a drive unit and being connected respectively to ones of the pixel units that are adjacent thereto;

wherein the dual-gate array substrate further comprises common electrodes located in a different layer from the pixel units and comprising a plurality of main electrodes and a plurality of branching electrodes; and wherein an orthographic projection of one of the main electrodes on the dual-gate array substrate at least covers a corresponding one of the primary signal lines and does not overlap orthographic projections of two ones, adjacent to the corresponding one of the primary signal lines, of the pixel electrodes on the dual-gate array substrate.

EMBODIMENTS

In an embodiment of the present disclosure, a line width of each of the secondary signal lines is not greater than a line width of each of the primary signal lines.

In an embodiment of the present disclosure, the main electrodes of the common electrodes are disposed in an extension direction of the primary signal lines, the branching electrodes are disposed to be parallel to the main electrodes, a pattern of the common electrodes formed by any adjacent two of the main electrodes and the secondary electrodes between the two of the main electrodes corresponds to a corresponding one of the pixel units, and the secondary signal lines are connected to the common electrodes;

wherein any any adjacent two of the main electrodes include a first main electrode and a second main electrode, an orthographic projection of the first main electrode on the array substrate covers an orthographic projection of a corresponding one of the primary signal lines on the dual-gate array substrate, and does not overlap orthographic projections of the ones, adjacent to the corresponding one of the primary signal lines, of the pixel electrodes on the dual-gate array substrate; and an orthographic projection of the second main electrode, adjacent to the first main electrode, on the dual-gate array substrate covers an orthographic projection of a corresponding one of the secondary signal lines on the dual-gate array substrate and does not overlap orthographic projections of the ones, adjacent to the corresponding one of the secondary signal lines, on the dual-gate array substrate.

In an embodiment of the present disclosure, the orthographic projection of the second main electrode, adjacent to the first main electrode, on the dual-gate array substrate coincides with the orthographic projection of the corresponding one of the secondary signal lines on the dual-gate array substrate.

In an embodiment of the present disclosure, the main electrodes of the common electrodes are disposed in an extension direction of the primary signal lines respectively, the branching electrodes are disposed to be parallel to the main electrodes, a pattern of the common electrodes formed by any adjacent two of the main electrodes and the secondary electrodes between the two of the main electrodes corresponds to a corresponding one of the pixel units; and wherein orthographic projections of the main electrodes on the array substrate cover orthographic projections of the primary signal lines on the dual-gate array substrate respectively, and do not overlap orthographic projections of the ones, adjacent to the primary signal lines, of the pixel electrodes on the dual-gate array substrate; and viewed in a direction orthogonal to the dual-gate array substrate, no main electrode is provided over the secondary signal lines.

In an embodiment of the present disclosure, the main electrodes of the common electrodes are disposed in an extension direction of the primary signal lines respectively, the branching electrodes are disposed in a direction across the primary signal lines, and a pattern of the common electrodes formed by any adjacent two of the main electrodes and the branching electrodes between the two main electrodes corresponds to adjacent two of the pixel units; and wherein orthographic projections of adjacent two of the main electrodes on the dual-gate array substrate at least cover the primary signal lines and do not overlap orthographic projections of the ones, adjacent the primary signal lines, of the pixel electrodes on the dual-gate array substrate; and a pattern of the branching electrodes at a boundary between adjacent two of the adjacent pixel units is continuous.

In an embodiment of the present disclosure, the dual-gate array substrate further includes a photo spacer disposed at either side of each of the secondary signal lines and the photo spacer has two ends with different sizes; and wherein between each pair of the primary signal line and the secondary signal line and within a space between adjacent two of the pixel units, the thin film transistor is disposed a side of the space close to the primary signal line and a metal pad is disposed a side of the space close to the corresponding secondary signal line.

In an embodiment of the present disclosure, the photo spacer has a frustoconical shape.

In an embodiment of the present disclosure, the dual-gate array substrate further includes a metal pad configured such that an end of the photo spacer with a greater size is disposed on a side surface of the metal pad facing away from the pixel electrode, wherein the metal pad and source and drain electrodes of the thin film transistor are different portions of a same metal film.

In an embodiment of the present disclosure, the metal pad is located between two gate lines in the first direction.

In an embodiment of the present disclosure, an orthographic projection of the photo spacer on a base substrate falls into an orthographic projection of the metal pad on the base substrate.

In an embodiment of the present disclosure, the metal pad is integrally formed with the secondary signal line, and the metal pad and the secondary signal line are located in the same layer.

In an embodiment of the present disclosure, the primary signal lines and the second signal lines are broken lines.

A display device includes a color film substrate, and further comprises the above dual-gate array substrate.

In an embodiment of the present disclosure, a black matrix is provided, at a position corresponding to the secondary signal lines in the dual-gate array substrate, in the color film substrate, wherein an orthographic projection of the black matrix on the dual-gate array substrate coincides with an orthographic projection of the secondary signal lines on the array substrate.

BRIEF DESCRIPTION OF THE DRAWINGS

In order to illustrate technical solutions of embodiments of the present disclosure more clearly, drawings required for description of the embodiments are introduced briefly as below. Obviously, the drawings in the below description are merely some embodiments of the present invention; for those skilled in the art, other drawings may be obtained based on these drawings without inventive labor.

DETAILED DESCRIPTION OF PREFERRED EMBODIMENTS

In order to make objects, technical solutions and advantages of the present disclosure be clearer, a further description in detailed of the present invention is made in conjunction with drawings. Obviously, embodiments described are merely some embodiments of the present invention, rather than all of them. Based on the embodiments of the present disclosure, all other embodiments that may be obtained by those skilled in the art without inventive labor belong to protective scope of the present invention.

Technical solutions related to the present invention are described in detailed below by specific embodiments and the present invention may include but is not limited to the following embodiments.

Figure 1A:
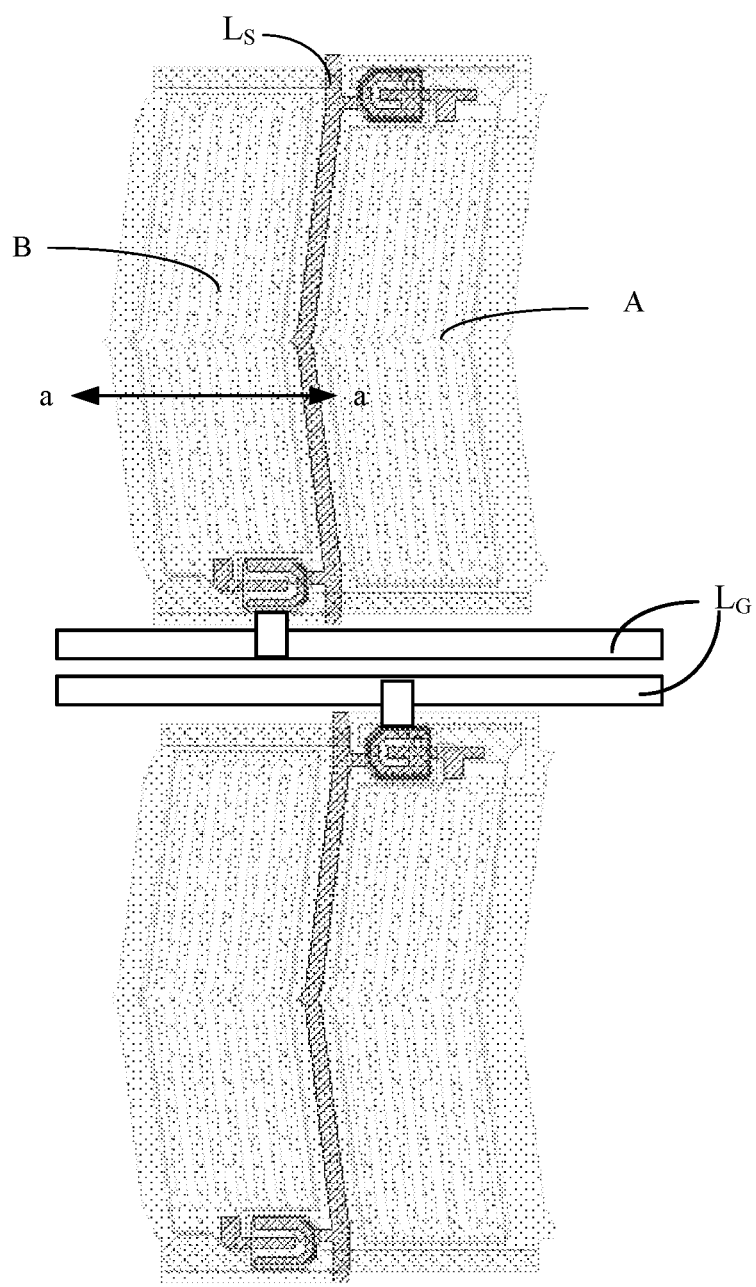
FIG. 1A and FIG. 1B are schematic views of a conventional dual-gate driven array substrate.
Figure 1B:
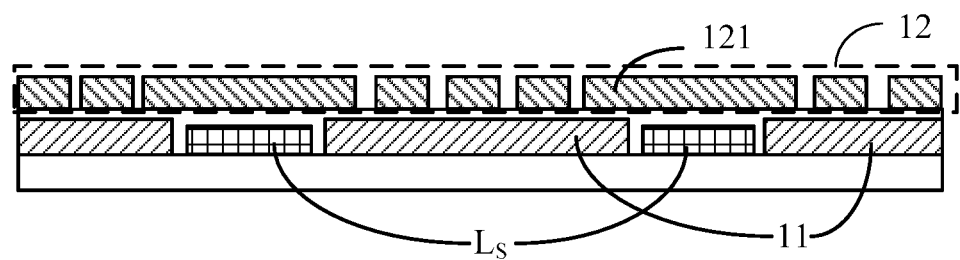

As shown in FIGS. 1A and 1B, schematic views of a currently common dual-gate driven array substrate are provided. For easy description, a fringe field switch (FFS) display mode is taken as an example, in which pixel units are respectively defined as a pixel unit A and a pixel unit B, adjacent to the pixel unit A in a horizontal direction. As shown in FIG. 1A, TFT devices of the two pixel units are respectively located over and below the pixel units, and are connected to a same data line Ls through respective source electrode lines, and, gate electrodes of the TFT devices are connected to gate lines $L_G$. It can be seen that two gate lines $L_G$ are provided between two adjacent pixel units in a vertical direction, in order for convenient for achieving a dual-gate drive. Referring to a cross section structural view as shown in FIG. 1B, in the array substrate, adjacent pixel unit A and pixel unit B are both connected to the data line Ls therebetween, and no data line is provided between the pixel unit B and another adjacent pixel unit A. It can be known from FIG. 1A and FIG. 1B that, no matter whether a data line Ls is provided between two adjacent pixel electrodes 11 or not, unwanted coupling capacitance will be generated. Thus, in order to reduce the coupling capacitance between adjacent pixel electrodes, it is necessary to configure main electrodes 121 of common electrodes 12 in a rather larger size at a position (as shown in the location defined by the dash line), preferably, such that a orthographic projection of the main electrodes 121, at the position, of the common electrodes on the array substrate may overlap with the adjacent pixel electrodes 11, so as to commendably shield affection of the coupling capacitance on rotation of liquid crystals.

However, as two gate lines are provided between adjacent pixel units in the dual-gate array substrate, i.e., one gate line is added compared to an array substrate in prior art, it is necessary to provide an additional black matrix correspondingly in the color film substrate, which causes decrement of an opening ratio of a panel formed by the array substrate. That is, transmission of the array substrate is reduced. Further, in order to reduce coupling capacitance, area of common electrodes at gaps between adjacent pixel units is increased and thus opening ratio and transmission of the array structure are reduced.

Figure 2A:
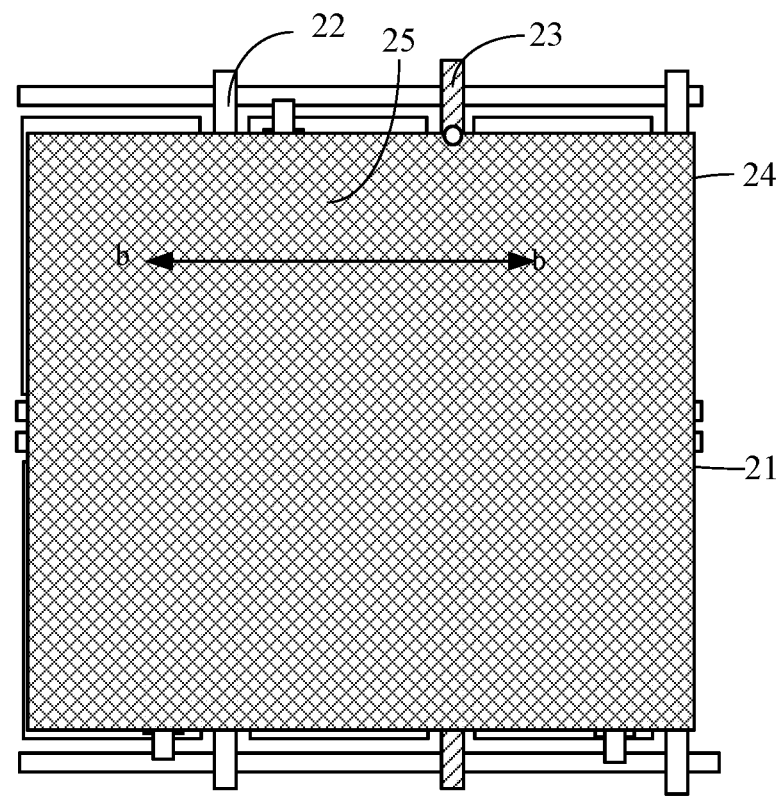
FIG. 2A and FIG. 2B are schematic structural views of a dual-gate array substrate according to an embodiment of the present disclosure.
Figure 2B:
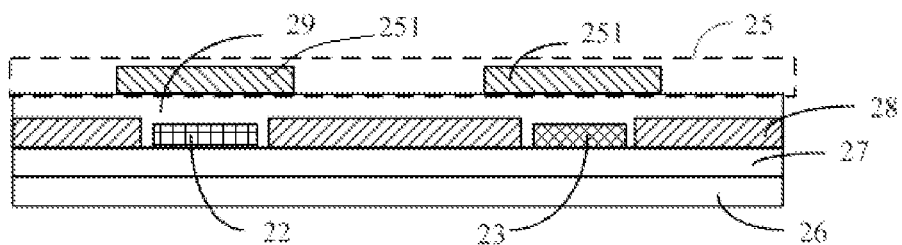

As shown in FIG. 2A, a structural schematic view of a dual-gate array substrate according to an embodiment of the present disclosure is provided. The array substrate is mainly provided with: a plurality of gate lines 21 arranged in a first direction and each extended in a second direction that is perpendicular to the first direction, a plurality of primary signal lines 22 and secondary signal lines 23 that are arranged alternately in a second direction and extended in the first direction, and a plurality of pixel units 24 being enclosed and defined by jointing the gate lines 21 insulatively with the primary signal lines 22 and the secondary signal lines 23. The pixel units 24, adjacent to the primary signal lines 22, are respectively connected to the primary signal lines 22. The primary signal lines 22, serving as data lines, are connected to a drive unit (not shown) and the secondary signal lines 23 are connected to the common electrodes 25. Only connection relationship of these components is shown in the drawings, and specific pattern and structure of layers are not actually shown. By referring to a cross section view along b-b line as shown in FIG. 2B, it is known that, the array substrate mainly includes: a base substrate 26, a first insulating layer 27, pixel electrodes 28 with a first pattern, primary signal lines 22 and secondary signal lines 23 alternately arranged between adjacent pixel electrodes 28, a second insulating layer 29 covering the pixel electrodes 18, the primary signal lines 22 and the secondary signal lines 23, and common electrodes 25 disposed over the second insulating layer 29. An electrical connection may be established between the secondary signal lines 23 and the common electrodes 25 through through-holes, or, in other conventional manner. The common electrodes 25 include a plurality of main electrodes 251 and a plurality of branching electrodes, and an orthographic projection of the main electrode 251 on the dual-gate array substrate has overlapping regions respectively with orthographic projections of corresponding pixel electrodes 28 adjacent to the main electrode 251 on the dual-gate array substrate, and at least covers a primary signal line 22.

It is known from above that, in order to improve the conventional dual-gate array substrate in terms of transmission, the primary signal lines and the secondary signal lines are arranged alternately within gaps between two adjacent ones of the pixel electrodes, such that the primary signal lines are configured to still be connected to the drive unit and, at respective locations, to be connected to source electrodes of the TFT within the pixel units which are located at either side of the primary signal lines, thereby achieving drive of two pixel units by a single primary signal line. Further, as the primary signal lines are generally applied with variational voltage signals, coupling capacitance is necessarily generated between the primary signal lines and their adjacent pixel electrodes. According to embodiments of the present disclosure, the main electrode is provided over the primary signal line to cover and shield the coupling capacitance. At the same time, the secondary signal line is connected to the common electrode such that a stabler voltage is applied to the secondary signal line, thereby completely avoiding occurrence of coupling capacitance between it and its adjacent pixel electrodes. Thus, according to the embodiment of the present disclosure, it is not necessary to reduce coupling capacitance in the manner of increasing size of the main electrodes in prior art, that is, it is not necessary to configure the main electrodes in large size over the secondary signal lines, and thus opening ratio of the array substrate may be increased.

In the embodiment of the present disclosure, the described primary signal lines are data lines.

Further, in the embodiment of the present disclosure, a width of the secondary signal line is not greater than that of the primary signal line, such that a size of the black matrix correspondingly at a side of the array substrate facing to a color film substrate may be reduced, so as to increase opening ratio of the dual-gate array substrate.

Figure 3A:
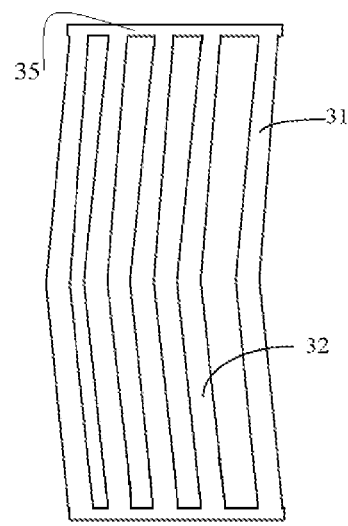
FIG. 3A is a schematic view of a pattern of a pixel unit in an array substrate in a FFS display mode.
Figure 3B:
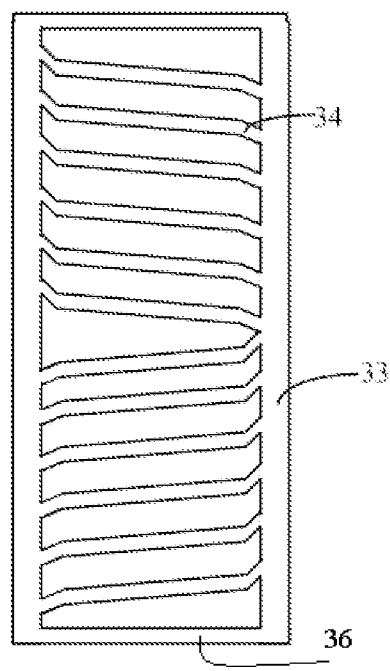
FIG. 3B is a schematic view of a pattern of a pixel unit in an array substrate in a AFFS display mode.

In order to describe the above solutions more clearly, some specific embodiments are described to illustrate solutions of the present disclosure. It is noted that, the present disclosure is mainly directed to structures of the dual-gate array substrate which operate in fringe field switching (FFS) and advanced fringe field switching (AFFS) display modes, respectively, in which a pattern of the common electrodes in one of the pixel units of the array substrate in the FFS display mode is shown in FIG. 3A and a pattern of the common electrodes in one of the pixel units of the array substrate in the AFFS display mode is shown in FIG. 3B. The difference between structures of the array substrate in the above two display modes resides in the patterns of the common electrodes. Specifically, in the dual-gate array substrate in a FFS display mode, the main electrodes 31 and the branching electrodes 32 are arranged to be in parallel and nearly to be extended along a direction of the data lines, and generally are arranged in a zigzag shape as shown in FIG. 3A. In the dual-gate array substrate in an AFFS display mode, the main electrodes 33 and the branching electrodes 34 are arranged nearly perpendicularly, and the main electrodes 33 are arranged in an extension direction of the data lines while the branching electrodes 34 are arranged in a "V" shape between the adjacent ones of the main electrodes. The main electrodes 33 and the branching electrodes 34 are connected through connection portions 35, 36.

Figure 4A:
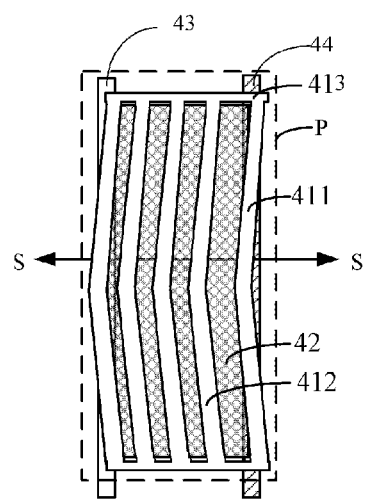
FIG. 4A is a schematic structural view of an array substrate in a FFS display mode according to an embodiment.
Figure 4B:
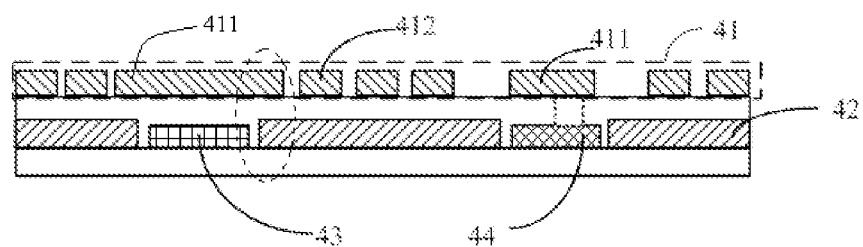
FIG. 4B is a schematic cross section view of the array substrate in the FFS display mode according to the embodiment.

An embodiment of the present disclosure is described in conjunction with FIG. 4 as below. As shown in FIG. 4A, a structural schematic view of the array substrate in the FFS display mode according to the embodiment of the present disclosure is provided, in which a pattern of the common electrodes formed by any two adjacent main electrodes 411 of the common electrodes 41 and the branching electrodes 412 between the two adjacent main electrodes 411 corresponds to one pixel unit P; the main electrodes 411 and the branching electrodes 412 are connected through connection portions 413. By referring to a structural cross section view of FIG. 4B, an orthographic projection of a first main electrode 411 (left main electrode in FIG. 4B) on the dual-gate array substrate has overlapping regions (as denoted by an elliptical block in dash line) respectively with orthographic projections of the pixel electrodes 42, adjacent to the first main electrode 411, on the dual-gate array substrate, and at least covers a primary signal line 43. An orthographic projection of a second main electrode 411 (right main electrode in FIG. 4B), adjacent to the first main electrode, on the dual-gate array substrate is located within a gap between two adjacent pixel electrodes 42 and covers a secondary signal line 44. In addition, the dual-gate array substrate further includes an insulating layer and other related layers, which are not illustrated for easy description. According to the above solution, the secondary signal lines are connected to the common electrodes such that occurrence of coupling capacitances between the secondary signal lines and their adjacent pixel electrodes may be avoided, furthermore, the orthographic projections of the main electrodes, over the secondary signal lines, on the dual-gate array substrate are configured to locate within the gaps between two adjacent pixel electrodes and cover the corresponding secondary signal lines such that a stable capacitance generated between the secondary signal lines and their adjacent pixel electrodes may overlap with a capacitance generated between the pixel electrodes and the common electrode, to obtain a storage capacitance required to the dual-gate array substrate, thereby achieving a better control on a voltage at boundary between the pixel electrodes and the common electrodes. In addition, as an electrical field for rotation of the liquid crystal in the structure in FFS display mode has the same direction as an overlapped electrical field in the overlapping region and is rather stable, an electrical field generated by the storage capacitance after being overlapped may promote the rotation of the liquid crystal in the overlapping region and thus increase transmission of the panel. Herein, it is noted that "first" and "second" do not mean any order and materiality, but are merely used for naming two different main electrodes. For example, in the embodiment, the orthographic projection of the first main electrode on the array substrate has overlapping regions with the orthographic projections of the pixel electrodes, adjacent to the first main electrode, on the dual-gate array substrate, and at least covers the corresponding primary signal line, and the orthographic projection of the second main electrode on the dual-gate array substrate is located within the gap between two adjacent pixel electrodes and covers the corresponding secondary signal line.

Further, according to the above embodiment, the orthographic projection of the second main electrode (the right main electrode in FIG. 4B), adjacent to the first main electrode, on the dual-gate array substrate may coincide with the secondary signal line. In view that the electrical field for rotation of the liquid crystal in the present disclosure is an edge electrical field between the pixel electrodes and the common electrodes, in order to obtain a good overlapping between the edge electrical field, between the pixel electrodes and the common electrodes, and an edge electrical field, between the pixel electrodes and the secondary signal line, and to avoid affection on the edge electrical field, between the pixel electrodes and the common electrodes, from the edge electrical field, between the pixel electrodes and the secondary signal line, preferably, the orthographic projection of the main electrode of the common electrode on the dual-gate array substrate coincide with the secondary signal line. With this configuration, the overlapped edge electrical field may obtain an optimal value to improve rotation of the liquid crystal in the boundary between the pixel electrodes and the common electrodes and thus to improve transmission of the panel.

Figure 5A:
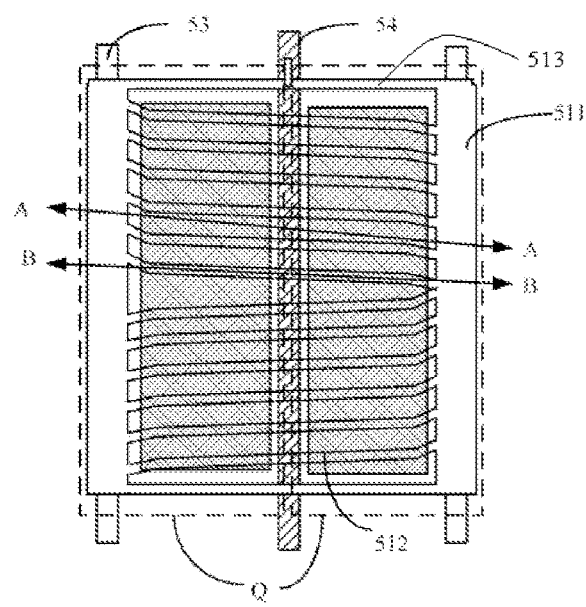
FIG. 5A is a schematic structural view of an array substrate in an AFFS display mode according to another embodiment of the present disclosure.
Figure 5B:
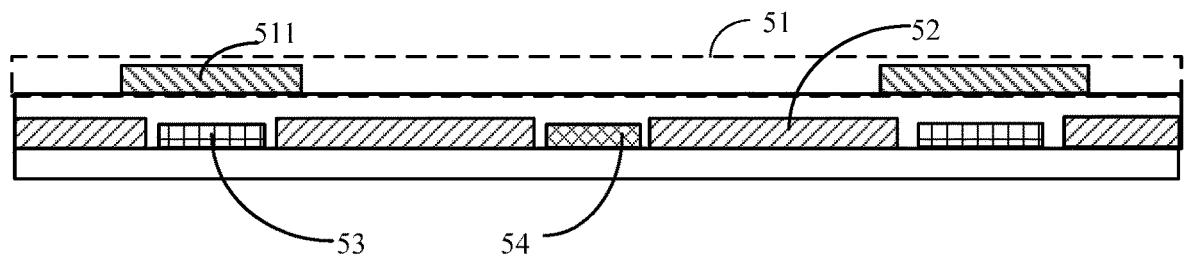
FIG. 5B and FIG. 5C are respectively schematic cross section views, along line A-A and line B-B, of the array substrate in the AFFS display mode according to the another embodiment of the present disclosure.
Figure 5C:
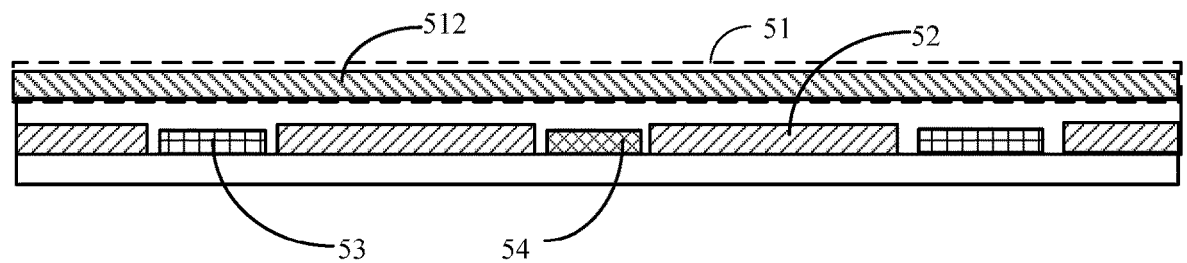

An embodiment of the present disclosure is described as below by referring to FIG. 5. As shown in FIG. 5A, a structural schematic view of an array substrate in AFFS display mode according to another embodiment is provided, in which main electrodes 511 of common electrodes 51 are disposed in an extension direction of primary signal lines 53, branching electrodes 512 are disposed in a direction transverse to the primary signal lines 53, or, in other words, the branching electrodes 512 are disposed in a direction across the primary signal lines 53. A pattern of the common electrodes formed by any adjacent two of the main electrodes 511 and the branching electrodes 512 therebetween corresponds to two adjacent pixel units Q; the main electrodes 511 and the branching electrodes 512 are connected through connection portions 513. Referring to a cross section view along line A-A of FIG. 5B and a cross section view along line B-B of FIG. 5(c), orthographic projections of two main electrodes 511 on the dual-gate array substrate have overlapping regions with orthographic projections of the pixel electrodes 52, adjacent to the respective main electrode 511, on the dual-gate array substrate, respectively and at least cover the primary signal lines 53. A pattern of the branching electrodes 512 at a boundary between two adjacent pixel units Q is continuous. According to the above solution, the secondary signal lines 54 are connected to the common electrodes so as to prevent occurrence of coupling capacitance between the secondary signal lines and their adjacent pixel electrodes. Further, in this display mode, as the direction of the electrical field for rotation of the liquid crystal is different from that of the overlapped electrical field in the overlapping region, the main electrodes disposed over the secondary signal lines may be removed while increasing the size of the pixel electrodes adjacent to the secondary signal lines, such that the overlapping regions between the branching electrodes and the pixel electrodes increases (referring to the cross section view as shown in FIG. 5(c)). Further, as increase of the overlapping region may increase the electrical field for rotation of the liquid crystal, and more critically, the increased overlapping region is located at boundary between the pixel electrode and the secondary signal line, the rotation of the liquid crystal at the boundary may be promoted and thus transmission of the panel may be increased.

Figure 6:
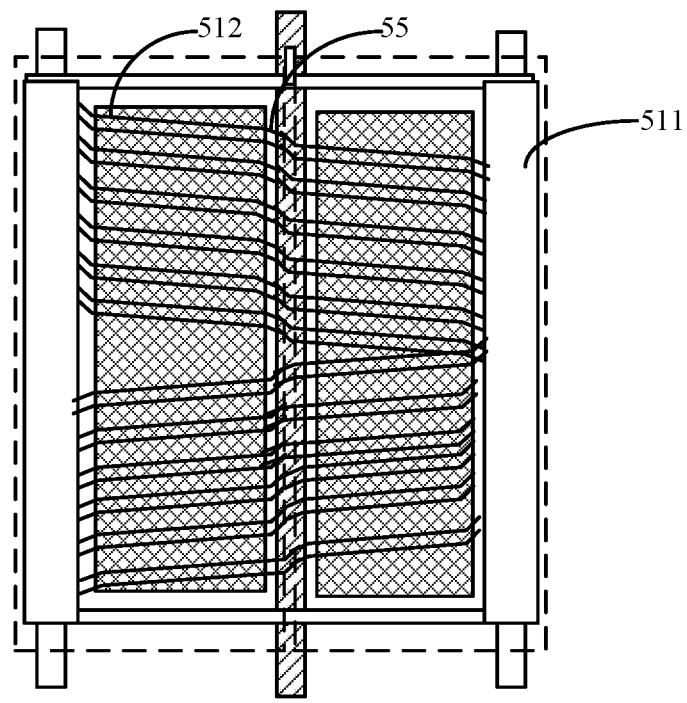
FIG. 6 is a schematic view of the branching electrodes, each having a corner structure, of the common electrodes in the another embodiment of the present disclosure.

Further, according to the above another embodiment, referring to FIG. 6, the branching electrodes 512 are each provided with a corner structure 55 at the boundary between the two adjacent pixel units Q. As s signal line is also disposed between the adjacent pixel units, a black matrix is needed for blocking. In this instant, it tends to encounter a display defect due to touch operation at the region where the signal line is located. As such, according to the present disclosure, the corner structure is provided at the boundary between the adjacent pixel units, to eliminate the display defect and thereby to alleviate uneven display caused by movement or pressure action during touch operation.

In the embodiment, a line width of each of the secondary signal lines is not greater than a line width of each of the primary signal lines.

In an embodiment of the present disclosure, the secondary signal line is made of metal or transparent oxide.

In a possible embodiment, the secondary signal line is made of tin indium oxide, in order to improve transmission of the dual-gate array substrate.

Figure 7A:
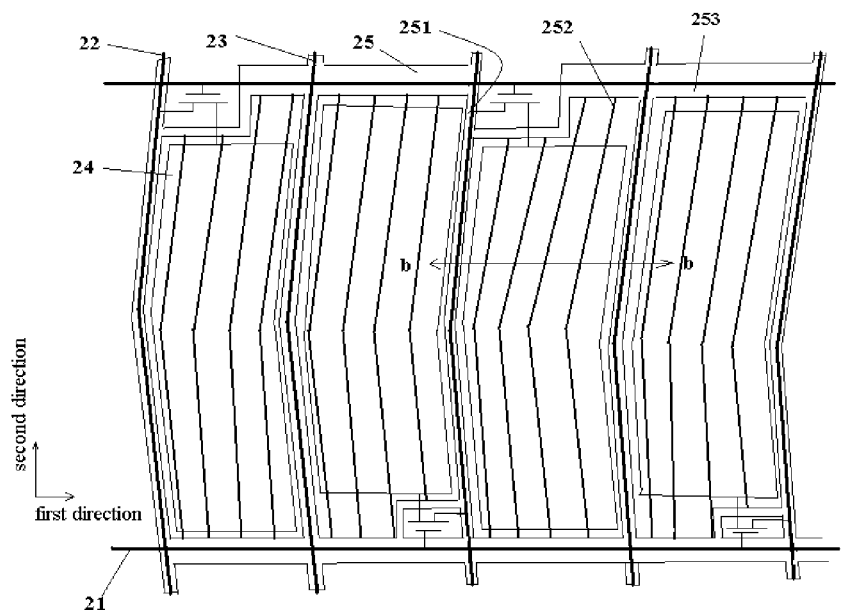
FIG. 7A and FIG. 7B are schematic structural views of a dual-gate array substrate according to an embodiment of the present disclosure.

In one embodiment of the present disclosure, as shown in FIG. 7A, a schematic diagram of a structure of a dual-gate array substrate is illustrated. The array substrate mainly includes: a plurality of gate lines 21 arranged along a first direction and each extended in a second direction that is perpendicular to the first direction, a plurality of primary signal lines 22 and secondary signal lines 23 that are arranged alternately in the second direction and extended in the first direction, and a plurality of pixel units 24 being enclosed and defined by jointing the gate lines 21 insulatively with the primary signal lines 22 and the secondary signal lines 23. The pixel units 24, adjacent to the primary signal lines 22, are respectively connected to the primary signal lines 22. The primary signal lines 22, serving as data lines, are connected to a drive unit and the secondary signal lines 23 are connected to the common electrodes 25. Only connection relationship of these components is shown in the drawings, and specific pattern and structure of layers are not actually shown. In the embodiment, it is illustrated that the primary signal lines 22 are extended in the first direction and the gate lines 21 are extended in the second direction; however, it is not limited that the primary signal lines 22 and the secondary signal lines 23 and the gate lines 21 are linear. Instead of, the primary signal lines 22 and the secondary signal lines 23 may be broken lines or may have curvature or curved portions.

Figure 7B:
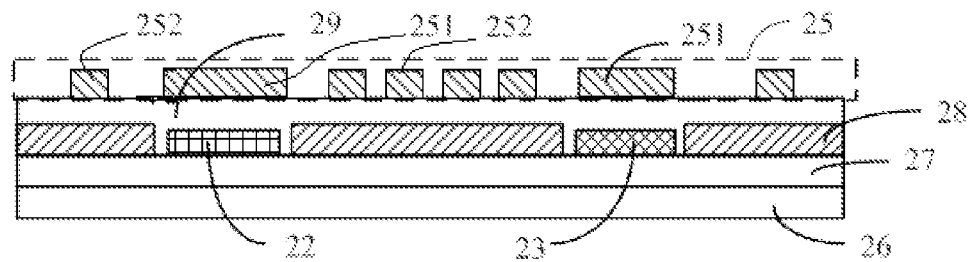

By referring to a cross section view along b-b line as shown in FIG. 7B, it is known that, the array substrate mainly includes: a base substrate 26, a first insulating layer 27, pixel electrodes 28 with a first pattern, primary signal lines 22 and secondary signal lines 23 alternately arranged between adjacent pixel electrodes 28, a second insulating layer 29 covering the pixel electrodes 18, the primary signal lines 22 and the secondary signal lines 23, and common electrodes 25 disposed over the second insulating layer 29. An electrical connection may be established between the secondary signal lines 23 and the common electrodes 25 through through-holes, or, in other conventional manner. The common electrodes 25 include a plurality of main electrodes 251 and a plurality of branching electrodes, and an orthographic projection of the main electrode 251 on the dual-gate array substrate does not overlap orthographic projections of corresponding pixel electrodes 28 adjacent to the primary signal line 22 on the dual-gate array substrate, and at least covers the primary signal line 22. In other words, the orthographic projection of the main electrode 251 on the dual-gate array substrate 251 may cover the secondary signal lines 23, and does not overlap the orthographic projections of corresponding pixel electrodes 28 adjacent to the secondary signal lines 23 on the dual-gate array substrate.

It is known from above that, in order to improve the conventional dual-gate array substrate in terms of transmission, the primary signal lines and the secondary signal lines are arranged alternately within gaps between two adjacent ones of the pixel electrodes, such that the primary signal lines are configured to still be connected to the drive unit and, at respective locations, to be connected to source electrodes of the TFT within the pixel units which are located at either side of the primary signal lines, thereby achieving drive of two pixel units by a single primary signal line. At the same time, the main electrode over the primary signal line is configured to have a reduced size such that the orthographic projections of main electrode does not overlap the orthographic projections of corresponding pixel electrodes adjacent to the primary signal line on the dual-gate array substrate, thereby increasing an opening ratio of the array substrate and improving display performance. At the same time, the secondary signal line is connected to the common electrode such that a stabler voltage is applied to the secondary signal line, thereby completely avoiding occurrence of coupling capacitance between it and its adjacent pixel electrodes. At the same time, the secondary signal line is configured such that the orthographic projection of the main electrode over the secondary signal line neither overlaps the orthographic projections of corresponding pixel electrodes adjacent to the secondary signal line on the dual-gate array substrate, thereby increasing an opening ratio of the array substrate. The embodiment, being distinctive from the technical scheme in related art where a size of a main electrode is increased to reduce a coupling capacitance, is provided to reduce the size of the main electrode over the primary signal line, which has a greater size than the secondary signal line, so as to increase the opening ratio of the array substrate.

Figure 10:
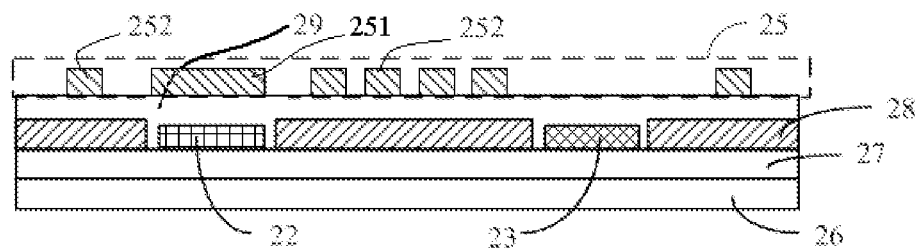
FIG. 10 is a cross section view of a dual-gate array substrate in a FFS display mode according to an embodiment of the present disclosure, wherein no main electrode is provided over the secondary signal line.

In another embodiment of the present disclosure, as shown in FIG. 10, a structure of the array substrate includes the structure as shown in FIG. 7, and however, in the structure of the present embodiment, as shown in the cross-sectional view FIG. 10, no main electrode is provided above the secondary signal line 23. In the present embodiment, since no main electrode is provided above the secondary signal line 23, the opening ratio and transmission of the array substrate can be further increased. The main electrode 251 is disposed above the primary signal line 22 such that the orthographic projection of the main electrode 251 over the primary signal line 22 on the dual gate array substrate does not overlap the orthographic projections of the pixel electrode 28 adjacent to the primary signal line 22 on the double gate array substrate and covers at least the orthographic projection of the primary signal line 22 on the dual gate array substrate, thereby the size of the main electrode over the primary signal line 22 being reducing and the opening ratio being increasing.

Further, in the embodiment of the present disclosure, the line width of the secondary signal line is not greater than the line width of the primary signal line, so that the size of the corresponding black matrix on the color film substrate can be reduced, thereby improving the opening ratio of the dual-gate array substrate.

Figure 8A:
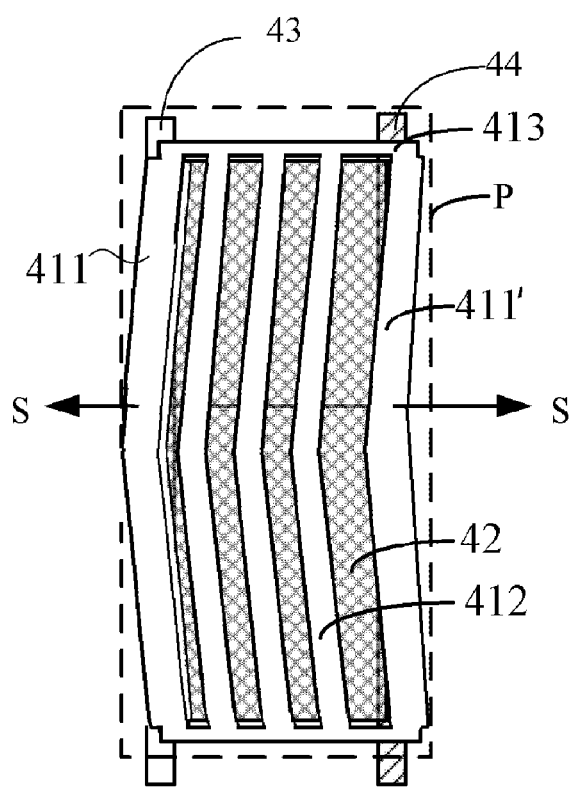
FIG. 8A and FIG. 8B are schematic structural views of a dual-gate array substrate in a FFS display mode according to an embodiment of the present disclosure.
Figure 8B:
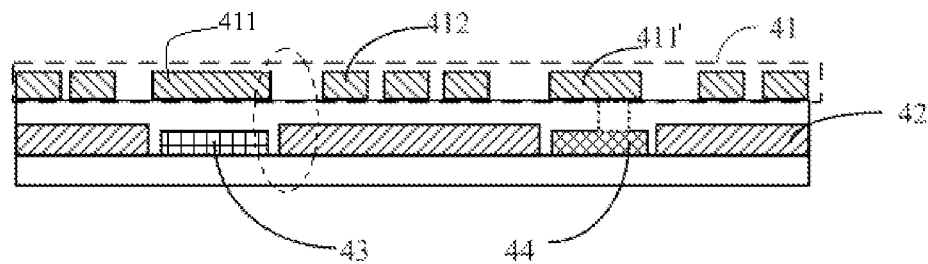

FIGS. 8A and 8B illustrate an embodiment of the present disclosure. Similar to the embodiment shown in FIGS. 7A and 7B, in the array substrate of the FFS display mode in FIGS. 8A and 8B, an orthographic projection of a first main electrode 411 (left main electrode in FIG. 8B) on the dual-gate array substrate has no overlapping region (as denoted by an elliptical block in dash line) with orthographic projections of the pixel electrodes 42, adjacent to the first main electrode 411, on the dual-gate array substrate, and covers at least a primary signal line 43. An orthographic projection of a second main electrode 411' (right main electrode in FIG. 8B), adjacent to the first main electrode 411, on the dual-gate array substrate is located within a gap between two adjacent pixel electrodes 42 and covers the secondary signal line 44. In the embodiment, the width of the main electrode above the secondary signal line 44 is the same as the width of the secondary signal line 44, in other words, the orthographic projection of the second main electrode 411' (the right main electrode shown in FIG. 8B), adjacent to the first main electrode 411, on the dual-gate array substrate coincides with the orthographic projection of the secondary signal line 44.

Figure 9A:
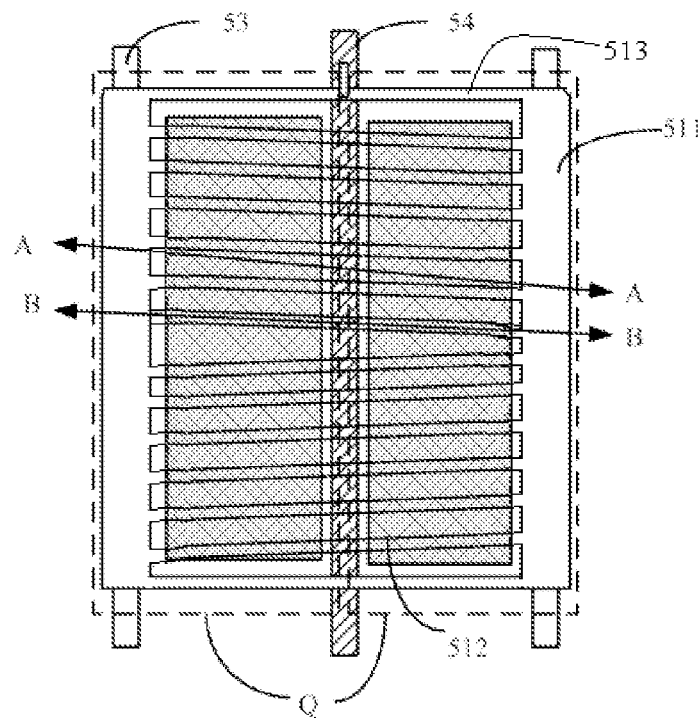
FIG. 9A and FIG. 9B are schematic structural views of a dual-gate array substrate in a AFFS display mode according to an embodiment of the present disclosure.

FIG. 9A illustrates an array substrate of the AFFS display mode according to an embodiment of the present disclosure, which is similar to the embodiment illustrated in FIG. 5. As shown in FIG. 9A, a main electrode 511 of the common electrode 51 is disposed along the direction in which the primary signal line 53 extends (in a first direction), a branching electrode 512 is extended in a direction (a second direction) transverse to the primary signal lines 53, or it is can be considered that the branching electrode 512 is extended in a direction across the primary signal lines 53. A pattern of the common electrodes formed by any adjacent two of the main electrodes 511 and the branching electrodes 512 therebetween corresponds to or covers two adjacent pixel units Q. Referring to a cross section view along line A-A of FIG. 9B, orthographic projections of two main electrodes 511 on the dual-gate array substrate each have no overlapping region with orthographic projections of the pixel electrodes 52, adjacent to the respective main electrode 511, on the dual-gate array substrate, and at least cover the primary signal lines 53. A pattern of the branching electrodes 512 at a boundary between two adjacent pixel units Q is continuous. The main electrode 511 and the branching electrode 512 are connected through a connection portion 513. In the embodiment, it is illustrated that the primary signal lines 22 and the secondary signal lines 23 are extended in the first direction and the gate lines are extended in the second direction; however, it is not limited that the primary signal lines 22 and the secondary signal lines 23 and the gate lines are linear. Instead of, the primary signal lines 22 and the secondary signal lines 23 may be broken lines or may have curvature or curved portions.

According to the above solution, the secondary signal line 54 is connected to the common electrode so as to prevent occurrence of coupling capacitance between the secondary signal line and its adjacent pixel electrodes. Further, in this display mode, as the direction of the electrical field for rotation of the liquid crystal is different from that of the overlapped electrical field in the overlapping region, the main electrodes disposed over the secondary signal lines may be removed while increasing the size of the pixel electrodes adjacent to the secondary signal lines, such that the size of the overlapping regions between the branching electrodes and the pixel electrodes increases. Further, as increase of the overlapping region may increase the electrical field for rotation of the liquid crystal, and more critically, the increased overlapping region is located at boundary between the pixel electrode and the secondary signal line, the rotation of the liquid crystal at the boundary may be promoted to rotate and thus transmission of the panel may be increased.

Based on the above embodiments, it is known that the corner structure 55 as shown in FIG. 6 may be omitted. In the embodiments as shown in FIGS. 7-9, the corner structure 55 is not provided.

Figure 9B:
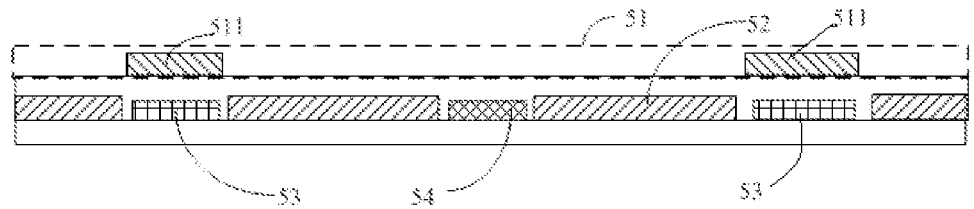
Figure 11:
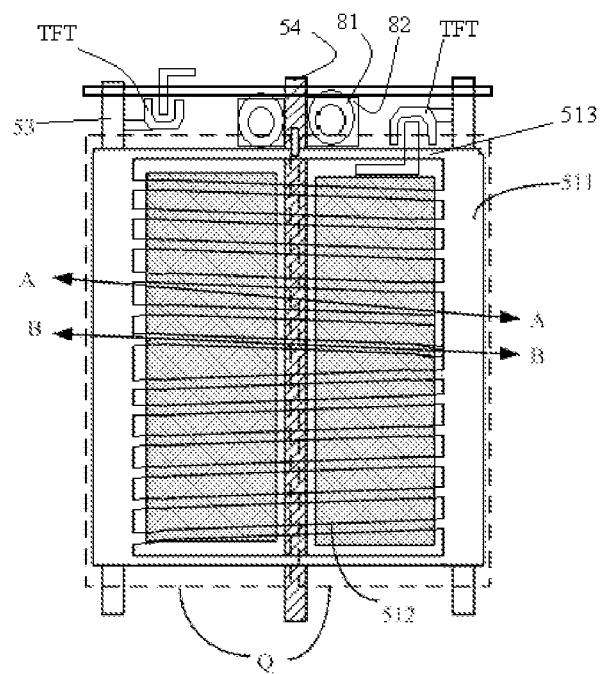
FIG. 11 is a schematic structural view of a dual-gate array substrate in a AFFS display mode according to an embodiment of the present disclosure, in which a photo spacer (PS) is provided.

In an embodiment of the present disclosure, a dual-gate array substrate is provided, which may be a modification based on the embodiments shown in FIG. 7 (including FIGS. 7A, 7B), FIG. 8 (including FIGS. 8A, 8B), and FIG. 9 (including FIGS. 9A, 9B). As an example, the present embodiment includes a dual-gate array substrate as shown in FIG. 9, and further includes a photo spacer (PS) 81. As shown in FIG. 11, the photo spacer 81 is disposed on the double-gate array substrate as a spacer, for example, disposed between the dual-gate array substrate and the color filter substrate, during assembly of the dual-gate array substrate, which is different from the conventional design including a spacer disposed on the color filter substrate. In this embodiment, the dual-gate array substrate may further include a metal pad 82; the metal pad 82 is disposed on either side of the secondary signal line 54 of the dual-gate array substrate, and the metal pad 82 may be formed by a part of a metal film used to form source and drain electrodes of a thin film transistor (TFT). Here, the metal pad 81 may be formed at the same time when the source and drain electrodes are formed, that is, a pattern of the metal pad 81 and a pattern of the source and drain electrodes of a thin film transistor (TFT) may be formed by first depositing a metal film and then patterning the metal film by a single patterning process. In the embodiment, the metal pad 82 is disposed in a position corresponding to the thin film transistor. For example, as shown in FIG. 11, in a pair of primary signal line-secondary signal line at left of FIG. 11, the thin film transistor is disposed at a right side of a primary signal line 53 while the metal pad 82 is disposed at a left side of the secondary signal line 54 that is at right side of the primary signal line 53, wherein the metal pad 82 and the source and drain electrodes of the thin film transistor located at the right side of the primary signal line 53 are formed through a single patterning process from a same metal film. In the pair of primary signal line-secondary signal line at right of FIG. 11, the thin film transistor is disposed at a left side of the primary signal line 53 while the metal pad 82 is disposed at a right side of the secondary signal line 54 that is at left side of the primary signal line 53. In other words, between each pair of a primary signal line 53 and a secondary signal line 54, a thin film transistor is disposed close to a side of the primary signal line 53 and a metal pad 82 is disposed close to a side of the secondary signal line 54, wherein the metal pad 82 and the source and drain electrodes of the thin film transistor located at the right side of the primary signal line 53 are formed through a single patterning process from a same metal film. The metal pad 82 may be opaque and thus may replace the function of the black matrix. In this embodiment, the metal pad 82 may replace a portion of the black matrix.

In the present embodiment, the photo spacer 81 is disposed on the metal pad 82, that is, one end of the photo spacer 81 is disposed on a side surface of the metal pad 82 away from the pixel electrode; or in other words, the metal pad 82 is disposed at the end of the photo spacer 81 facing the pixel electrode. From the above, it is known that, between each pair of the primary signal line 53 and the secondary signal line 54 and within a space between two adjacent pixel units, the thin film transistor is disposed a side of the space close to the primary signal line 53 and a metal pad 82 is disposed a side of the space close to the secondary signal line 54.

In the present embodiment as shown in FIG. 11, the metal pad 82 is shown as a rectangle, and the photo spacer 81 is shown as a frustoconical shape, that is, a diameter of the end of the photo spacer 81 facing toward the array substrate is greater than a diameter of the end of the photo spacer 81 facing away from the array substrate (thus, as viewed from one end as shown in FIG. 11, it appears that the end with a smaller diameter is located within the end with a greater diameter). The end having a greater diameter is disposed on the metal pad 82. An orthographic projection of the photo spacer 81 on the base substrate falls into an orthographic projection of the metal pad 82 on the base substrate. However, the photo spacer 81 may have other shape, and may be made of a transparent material, for example, a resin material.

During the assembly process of the array substrate, a part of the array substrate will be deformed under pressure. Provision of the photo spacer 81 can serve as a support to avoid deformation of the array substrate. In the present embodiment, since a thin film transistor (TFT) is provided in the vicinity of the primary signal line 53, that is, at least, for example, a metal layer for source/drain electrodes, a semiconductor layer (active layer), and the like are provided in the vicinity of the primary signal line 53, while those layers are not provided in the vicinity of the secondary signal line, a section height difference, on the dual-gate array substrate between the section including the primary signal line 53 and the section including the secondary signal line will be generated, which may cause uneven force received by different sections of the array substrate in the subsequent assembly. According to the present embodiment, the section height difference may be compensated by providing the metal pad 82 disposed adjacent to the secondary signal line 54 and further providing the photo spacer on the metal pad 82, such that the whole array substrate has a flatter surface including the layers. Further, the metal pad 82 and the photo spacer may be used for support for forming a liquid crystal cell. Further, it is advantageous to arrange the photo spacers on either side of the secondary signal line 54 and to dispose the photo spacers on the metal pad 82 which is in the same layer of the source and drain electrodes of the thin film transistor, because the photo spacer 81 is located away from a channel of the thin film transistor (TFT) and thus the photo spacer 81 does not exert pressure on the channel of the thin film transistor (TFT), thereby avoiding the channel characteristics from being adversely affected by the pressure and achieving less influence on the channel characteristics.

Figure 12:
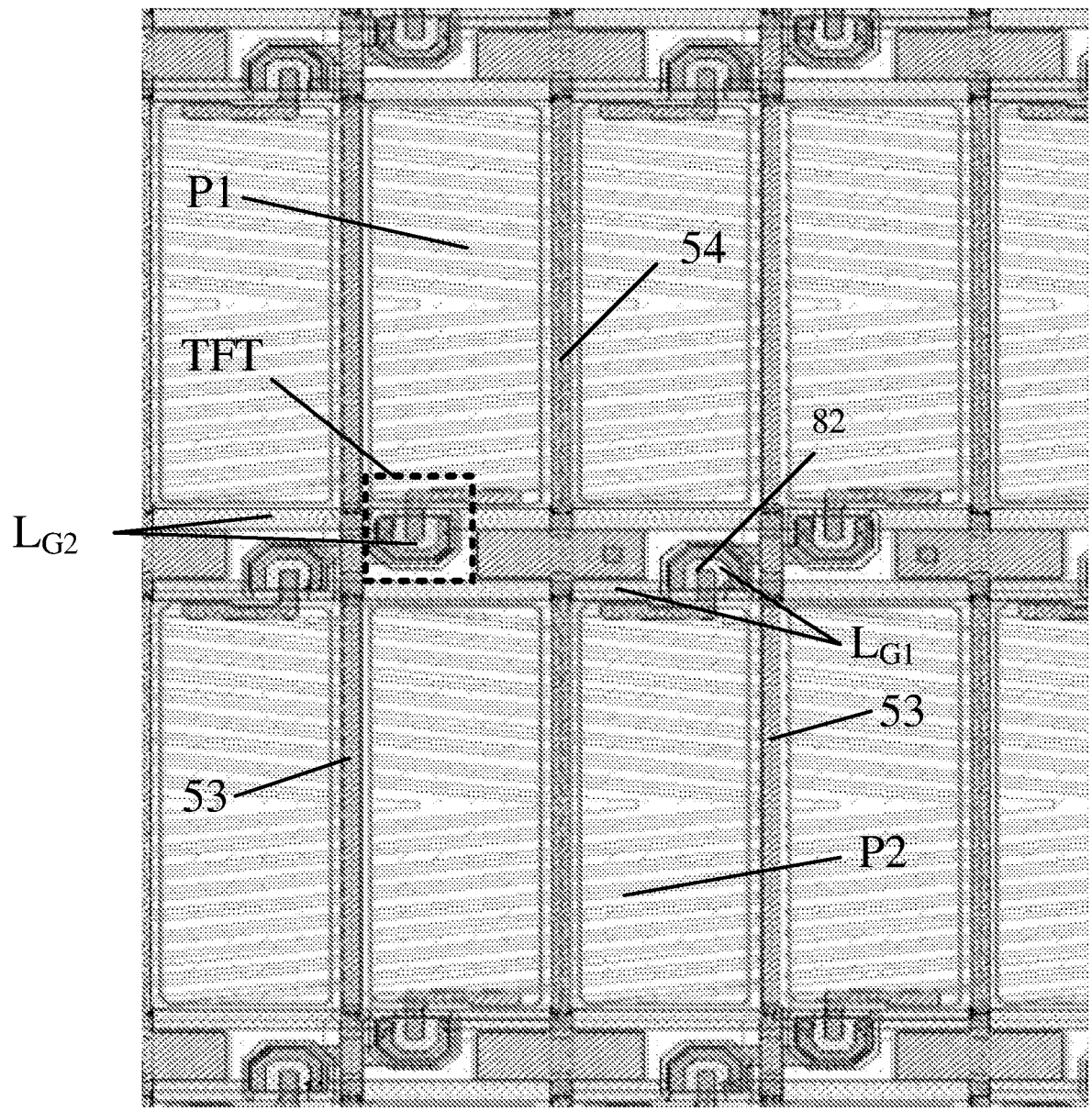
FIG. 12 is a schematic structural view of a dual-gate array substrate in a AFFS display mode according to an embodiment of the present disclosure.

FIG. 12 illustrates a dual-gate array substrate in a AFFS display mode according to an embodiment of the present disclosure, including two rows of pixel units adjacent in the vertical direction, and each row of pixel units includes a plurality of pixel units. As shown in FIG. 12, two gate lines $L_{G1}$ and $L_{G2}$ are provided between the two rows of pixel units adjacent in the vertical direction so as to achieve a dual-gate drive. The primary signal lines 53 and the secondary signal lines 54 extend in the first direction, and the gate lines $L_{G1}$ and $L_{G2}$ extend in the second direction. As shown in FIG. 12, a TFT device of a pixel unit P1 in an upper row of the two rows of pixel units is connected to a data line (a primary signal line 53) on the left side through its source electrode, and is connected to the gate line $L_{G2}$ through its gate electrode. The gate line $L_{G2}$ extending in the second direction has a protrusion at a connection with the gate electrode of the TFT device, the protrusion is protruded in the first direction, and more specifically, in a direction away from the pixel unit P1. A TFT device of a pixel unit P2 in a lower row of the two rows of pixel units is connected to a data line (another primary signal line 53) on the right side through its source electrode, and is connected to the gate line $L_{G1}$ through its gate electrode. The gate line $L_{G1}$ extending in the second direction has a protrusion at a connection with the gate electrode of the TFT device, the protrusion is protruded in the first direction, and more specifically, in a direction away from the pixel unit P2. An opening of U-shaped channel of each TFT device faces the gate line to which the TFT device is connected. The dual-gate array substrate is further provided with a metal pad 82. In the first direction, the metal pad 82 is provided between the two gate lines $L_{G1}$ and $L_{G2}$; and in the second direction, the metal pad 82 is provided on two sides of the secondary signal line 52, the metal pad 82 is integrally formed with the secondary signal line 54, and the metal pad 82 and the secondary signal line 54 are located in the same layer.

It should be noted that the primary signal lines 53 and the secondary signal lines 54 are not limited to be linear as shown in the aforementioned drawings.

Figure 13:
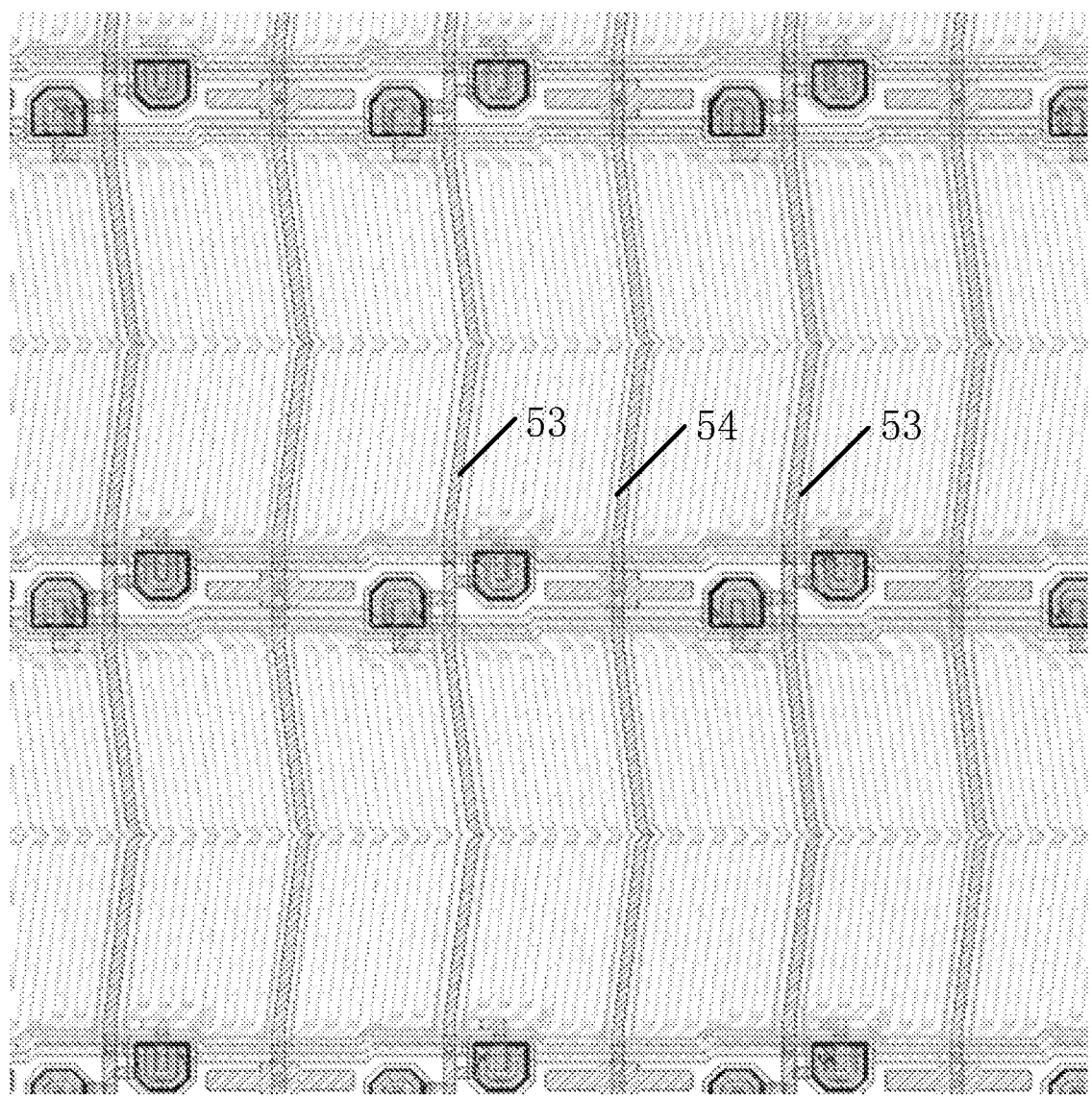
FIG. 13 is a schematic structural view of a dual-gate array substrate according to an embodiment of the present disclosure.

FIG. 13 illustrates a dual-gate array substrate according to another embodiment of the present disclosure, including two rows of pixel units adjacent in the vertical direction, and each row of pixel units includes a plurality of pixel units. As shown in FIG. 13, two gate lines are provided between the two rows of pixel units adjacent in the vertical direction so as to achieve a dual-gate drive. The primary signal lines 53 and the secondary signal lines 54 extend in the first direction, and the two gate lines extend in the second direction. Different from the embodiment as shown in FIG. 12, the primary signal lines 53 and the secondary signal lines 54 in the embodiment as shown in FIG. 13 are broken lines. Other structural details in the embodiment shown in FIG. 13 are similar to those in the embodiment shown in FIG. 12, and references may be made to the description of the embodiment shown in FIG. 12, which will not be repeated here.

In other embodiments, such as the embodiment shown in FIGS. 2-10, the photo spacer (PS) similar to the above embodiments may also be included, and details are not described herein again.

In addition, according to embodiments of the present disclosure, there further provides a display device including a color film substrate and, the dual-gate array substrate provided by any one of the embodiments of the present disclosure.

In an embodiment of the present disclosure, a black matrix is provided, in the color film substrate, at position corresponding to locations of the secondary signal lines in the dual-gate array substrate, in which orthographic projection of the black matrix on the dual-gate array substrate coincide with orthographic projection of the secondary signal lines on the dual-gate array substrate.

The display device according to the present disclosure may be any products or components that have a display function, including a liquid crystal panel, a mobile phone, a tablet computer, a television, a display, a notebook computer, a digital photo frame, a navigator and the like. Other components that are indispensable to compose the display device may be obtained, as being understood by those skilled in the art, and are not described in detailed, and should not be considered as limitation of the present invention.

Although the preferable embodiments of the present disclosure have been described, other variations and modifications of these embodiments may be made as long as those skilled in the art may understand the basic inventive concept of the present disclosure. The attached claims are intended to be interpreted to include the preferable embodiments and all variations and modifications that are fallen into the protective scope of the present disclosure.

Obviously, modifications and changes may be made within the spirit and scope of the present disclosure by those skilled in the art. Thus, provided that these modifications and changes would belong to the scope of the claims and their equal technology of the present invention, they were intended to be included in the scope of the present invention.

What is claimed is:

1. A dual-gate array substrate, comprising:
a plurality of gate lines arranged in a first direction, each of the gate lines being extended in a second direction that is perpendicular to the first direction;
a plurality of primary signal lines and secondary signal lines arranged alternately in the second direction and extended in the first direction; and
a plurality of pixel units each enclosed and defined by jointing adjacent two of the gate lines insulative with corresponding ones of the primary signal lines or the secondary signal lines, the pixel units each including pixel electrodes, the primary signal lines being connected to a drive unit and being connected respectively to ones of the pixel units that are adjacent thereto;
wherein the dual-gate array substrate further comprises common electrodes located in a different layer from the pixel electrodes and comprising a plurality of main electrodes and a plurality of branching electrodes;
wherein the secondary signal lines are connected to the common electrodes;
wherein an orthographic projection of one of the main electrodes on the dual-gate array substrate at least covers a corresponding one of the primary signal lines and does not overlap orthographic projections of two pixel electrodes, adjacent to the corresponding one of the primary signal lines, of the pixel electrodes on the dual-gate array substrate;
wherein each gate line comprises a protrusion.

2. The dual gate array substrate according to claim 1, wherein the protrusion of each gate line extends in the first direction.

3. The dual gate array substrate according to claim 2, wherein for two gate lines between two rows of pixel units adjacent in the first direction, the protrusion of one of the two gate lines and the protrusion of the other of the two gate lines extend in opposite directions in the first direction.

4. The dual gate array substrate according to claim 1, wherein two gate lines between two rows of pixel units adjacent in the first direction have two protrusions between two adjacent primary signal lines.

5. The dual gate array substrate according to claim 1, wherein for two gate lines between two rows of pixel units adjacent in the vertical direction, a centerline of the protrusion of one of the two gate lines in the second direction does not overlap with a centerline of the protrusion of the other of the two gate lines in the second direction.

6. The dual gate array substrate according to claim 1, wherein the main electrodes of the common electrodes are disposed in an extension direction of the primary signal lines, the branching electrodes are disposed to be parallel to the main electrodes, a pattern of the common electrodes formed by any adjacent two of the main electrodes and the secondary electrodes between the two of the main electrodes corresponds to a corresponding one of the pixel units;

wherein any adjacent two of the main electrodes include a first main electrode and a second main electrode, an orthographic projection of the first main electrode on the array substrate covers an orthographic projection of a corresponding one of the primary signal lines on the dual-gate array substrate, and does not overlap orthographic projections of the ones, adjacent to the corresponding one of the primary signal lines, of the pixel electrodes on the dual-gate array substrate; and an orthographic projection of the second main electrode, adjacent to the first main electrode, on the dual-gate array substrate covers an orthographic projection of a corresponding one of the secondary signal lines on the dual-gate array substrate and does not overlap orthographic projections of the ones, adjacent to the corresponding one of the secondary signal lines, on the dual-gate array substrate.

7. The dual-gate array substrate according to claim 6, wherein the orthographic projection of the second main electrode, adjacent to the first main electrode, on the dual-gate array substrate coincides with the orthographic projection of the corresponding one of the secondary signal lines on the dual-gate array substrate.

8. The dual gate array substrate according to claim 1, wherein the main electrodes of the common electrodes are disposed in an extension direction of the primary signal lines respectively, the branching electrodes are disposed to be parallel to the main electrodes, a pattern of the common electrodes formed by any adjacent two of the main electrodes and the secondary electrodes between the two of the main electrodes corresponds to a corresponding one of the pixel units; and wherein orthographic projections of the main electrodes on the array substrate cover orthographic projections of the primary signal lines on the dual-gate array substrate respectively, and do not overlap orthographic projections of the ones, adjacent to the primary signal lines, of the pixel electrodes on the dual-gate array substrate; and viewed in a direction orthogonal to the dual-gate array substrate, no main electrode is provided over the secondary signal lines.

9. The dual-gate array substrate according to claim 1, wherein the main electrodes of the common electrodes are disposed in an extension direction of the primary signal lines respectively, the branching electrodes are disposed in a direction across the primary signal lines, and a pattern of the common electrodes formed by any adjacent two of the main electrodes and the branching electrodes between the two main electrodes corresponds to adjacent two of the pixel units; and wherein orthographic projections of adjacent two of the main electrodes on the dual-gate array substrate at least cover the primary signal lines and do not overlap orthographic projections of the ones, adjacent the primary signal lines, of the pixel electrodes on the dual-gate array substrate; and a pattern of the branching electrodes at a boundary between adjacent two of the adjacent pixel units is continuous.

10. The dual-gate array substrate according to claim 1, wherein, the secondary signal lines are made of metal or transparent oxide.

11. The dual-gate array substrate according to claim 10, wherein, the secondary signal lines are made of tin indium oxide.

12. The dual-gate array substrate according to claim 1, further comprising a photo spacer disposed at either side of each of the secondary signal lines and the photo spacer has two ends with different sizes; and wherein between each pair of the primary signal line and the secondary signal line and within a space between adjacent two of the pixel units, the thin film transistor is disposed a side of the space close to the primary signal line and a metal pad is disposed a side of the space close to the corresponding secondary signal line.

13. The dual-gate array substrate according to claim 12, wherein the photo spacer has a frustoconical shape.

14. The dual-gate array substrate according to claim 12, further comprising a metal pad configured such that an end of the photo spacer with a greater size is disposed on a side surface of the metal pad facing away from the pixel electrode, wherein the metal pad and source and drain electrodes of the thin film transistor are different portions of a same metal film.

15. The dual-gate array substrate according to claim 14, wherein the metal pad is located between two gate lines in the first direction.

16. The dual-gate array substrate according to claim 14, wherein an orthographic projection of the photo spacer on a base substrate falls into an orthographic projection of the metal pad on the base substrate.

17. The dual-gate array substrate according to claim 14, wherein the metal pad is integrally formed with the secondary signal line, and the metal pad and the secondary signal line are located in the same layer.

18. The dual-gate array substrate according to claim 1, wherein the primary signal lines and the second signal lines are broken lines.

19. A display device comprising a color film substrate, wherein, the display device further comprises the dual-gate array substrate according to claim 1.

20. The display device according to claim 19, wherein, a black matrix is provided on the color film substrate, at a position corresponding to the secondary signal lines in the dual-gate array substrate, wherein an orthographic projection of the black matrix on the dual-gate array substrate coincides with an orthographic projection of the secondary signal lines on the dual-gate array substrate.

* * * * *